United States Patent
Vera Villarroel et al.

(10) Patent No.: US 9,728,829 B1
(45) Date of Patent: Aug. 8, 2017

(54) DC BLOCKING CIRCUIT WITH BIAS CONTROL AND INDEPENDENT CUT-OFF FREQUENCY FOR AC-COUPLED CIRCUITS

(71) Applicant: INPHI CORPORATION, Santa Clara, CA (US)

(72) Inventors: Ariel Leonardo Vera Villarroel, Porter Ranch, CA (US); Subramaniam Shankar, Thousand Oaks, CA (US); Steffen O. Nielsen, Newbury Park, CA (US)

(73) Assignee: INPHI CORPORATION, Santa Clara, CA (US)

( * ) Notice: Subject to any disclaimer, the term of this patent is extended or adjusted under 35 U.S.C. 154(b) by 139 days.

(21) Appl. No.: 14/879,461

(22) Filed: Oct. 9, 2015

(51) Int. Cl.
- *H04B 3/04* (2006.01)
- *H01P 1/20* (2006.01)
- *H03H 7/01* (2006.01)

(52) U.S. Cl.
CPC ......... *H01P 1/2007* (2013.01); *H03H 7/0123* (2013.01); *H03H 7/0153* (2013.01)

(58) Field of Classification Search
CPC ... H01P 1/2007; H03H 7/0123; H03H 7/0153
USPC ........................................................ 333/17.1
See application file for complete search history.

(56) References Cited

U.S. PATENT DOCUMENTS

2015/0280660 A1\* 10/2015 Azin ........................ H03F 3/185
                                                            330/260

\* cited by examiner

*Primary Examiner* — Robert Pascal
*Assistant Examiner* — Kimberly Glenn
(74) *Attorney, Agent, or Firm* — Richard T. Ogawa; Ogawa P.C.

(57) ABSTRACT

A circuit for blocking undesired input direct current of AC-coupled broadband circuits. The circuit includes a capacitor coupled to an input port and a common node. The input port receives a RF input signal. Additionally, the circuit includes a current source supplying a DC current to the common node leading a bias current to an output port. Further, the circuit includes a variable voltage source through an internal load and a close loop with an application circuit having an input load coupled to the output port to determine various bias voltages to control the bias current at the output port in association with a RF output signal that is substantially free of any input direct current originated from the RF input signal and is associated with an inherent low cut-off frequency independent of the various bias voltages.

18 Claims, 4 Drawing Sheets

US 9,728,829 B1

DC BLOCKING CIRCUIT WITH BIAS CONTROL AND INDEPENDENT CUT-OFF FREQUENCY FOR AC-COUPLED CIRCUITS

BACKGROUND OF THE INVENTION

The present invention relates generally to telecommunication techniques. More particularly, the present invention provides a method and a circuit for block undesired direct current (DC) out of input RF signals of AC-coupled broadband communication circuits while introducing a low cut-off frequency independently.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Over the past, AC-coupled high data rate broadband communication has been widely implemented via optical network, in which data signals are carried by laser light that is specifically modulated using various kinds of electro-optic modulators. Through various broadband communication circuits for transmitting the AC-coupled high-data rate signals, a DC blocking circuit is typically applied in many applications to inject/remove undesired input direct current (DC) or voltage in RF circuits without affecting the RF signal through the main transmission path. But designing a DC blocking circuit that provides a controllable bias (voltage and current) while independently and simultaneously defining a low cut-off frequency is challenging. Conventional designs of the DC blocking circuit usually are implemented with trade-offs in reduced voltage headroom, extra die area, unstable low cut-off frequency response. For example, a common approach is the use of a blocking capacitor and resistors (two resistors in series from the supply voltage to ground) with values selected to set a DC voltage for the internal circuit. The operation frequency range of the circuit depends on the capacitor and resistors values. To achieve broadband operation the capacitor and resistors need large values and consequently can occupy a large area. Furthermore, manufacturing process variation of the resistors changes the low-frequency cut-off. Alternatively, another approach uses a blocking capacitor in combination with a current source that pulls (or pushes) current through a resistor tied to the supply (or ground) to control the circuit bias voltage. The low-frequency cut-off depends on the resistor value. A lower cut-off requires a larger resistor, but the maximum value of the resistor is limited by the supply voltage and the voltage drop when conducting the bias current.

Therefore, an improved DC blocking circuit design is desired for isolating undesired DC signal out of AC-coupled high data-rate RF signals and defining a low cut-off frequency independently of the bias voltage and current.

BRIEF SUMMARY OF THE INVENTION

The present invention relates to broadband communication device and method. Various embodiments of the present invention provide an improved DC blocking circuit with controllable bias voltage and an independently defined low cut-off frequency. More specifically, a method of isolating DC signal out of AC-coupled RF signal is provided with a low cut-off frequency being defined independently from the bias voltage/current. In certain embodiments, the invention is applied for high bandwidth opto-electric data communication, though other applications are possible.

In a specific embodiment, the present invention provides a circuit for blocking undesired input direct current of AC-coupled broadband circuits. The circuit includes a capacitor having a first plate coupled to an input port and a second plate coupled to a common node. The input port receives an RF input signal. Additionally, the circuit includes a current source supplying a DC current to the common node leading a bias current to an output port. Furthermore, the circuit includes a variable voltage source through an internal load forming a close loop with an application circuit having an input load coupled to the output port for determining various bias voltages to control the bias current at the output port in association with an RF output signal. The RF output signal is substantially free of any input direct current originated from the RF input signal and is associated with an inherent low cut-off frequency independent of the various bias voltages.

In an alternative embodiment, the present invention provides a method for blocking undesired input direct current of AC-coupled broadband circuits. The method includes providing a capacitor coupled to an input port and a common node. The input port receives an RF input signal. Additionally, the method includes providing a DC current to the common node using a current source based on standard power supply. The DC current leads to a bias current at an output port coupled to the common node. The method further includes connecting an internal load to the common node. Furthermore, the method includes providing a variable voltage source to the internal load in a close loop including the output port coupled to an input load of an application circuit for determining various bias voltages to control the bias current. The method further includes generating an RF output signal in association with the bias current at the output port substantially free from any DC current originally in the RF input signal. Moreover, the method includes providing a low cut-off frequency associated with the RF output signal independent from the various bias voltages.

Many benefits are achieved by implementing the circuit of the present invention for isolating undesired DC signals in broadband communication. Isolation of DC voltage and current signals external to the circuit prevents negative impact in its performance, such as reduction of the circuit maximum operation frequency. Circuits designed using transistors require a predetermined and steady (DC) voltage and current at various bias conditions. Furthermore, the circuit of the present invention introduces a low cut-off frequency independently of the bias (voltage and current) required for optimal circuit performance. The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
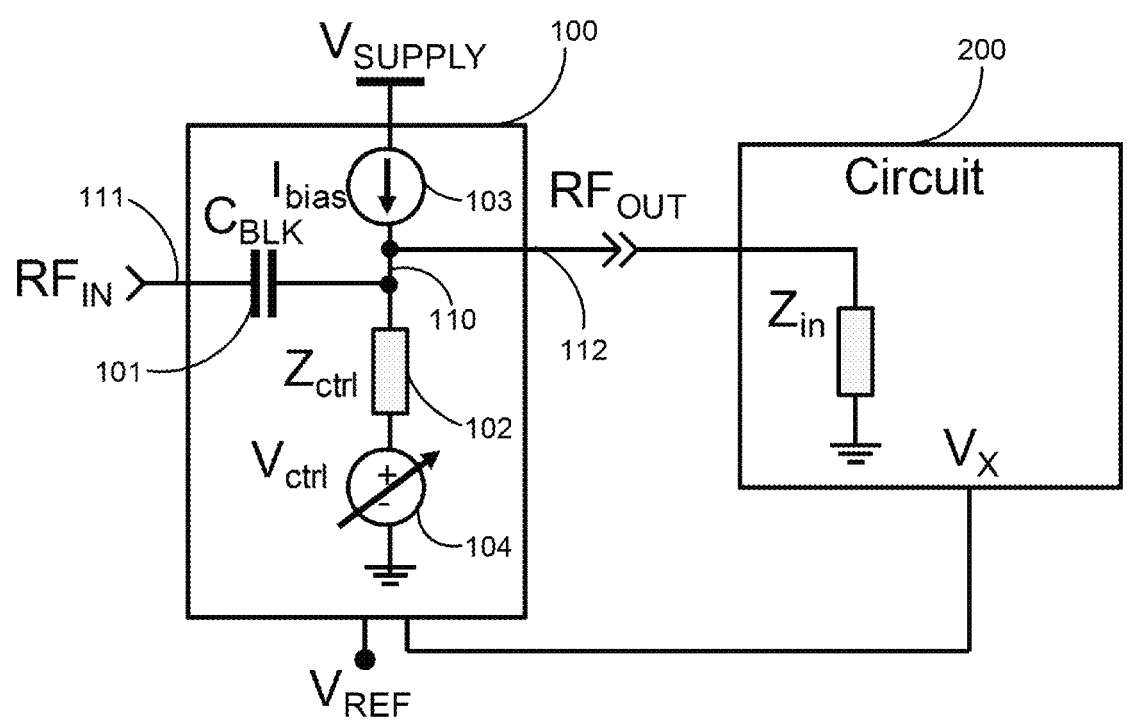
FIG. 1 is a diagram of a DC blocking circuit applied for isolating DC signal while providing an RF signal to an application broadband circuit according to an embodiment of the present invention.

The present invention relates to broadband communication device and method. Various embodiments of the present invention provide an improved DC blocking circuit with controllable bias voltage and an independently defined low cut-off frequency. More specifically, a method of isolating undesired DC signal out of AC-coupled RF input signal is provided with low cut-off frequency being defined independently from bias voltages. In certain embodiments, the invention is applied for high bandwidth opto-electric data communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a diagram of a DC blocking circuit applied for isolating DC signal while providing an RF signal to an application broadband circuit according to an embodiment of the present invention. This diagram is merely an example, which should not unduly limit the scope of the claims herein. One of ordinary skill in the art would recognize many variations, alternatives, and modifications. As shown, a DC blocking circuit 100 includes an input port 111 to receive a RF input signal $RF_{IN}$. The input port 111 is coupled directly to one plate of a blocking capacitor 101. An output port 112 is coupled to a common port 110 connected to another plate of the blocking capacitor 101. A current source 103 also is coupled between a power supply $V_{supply}$ to the common port 110 to provide a DC current $I_{bias}$ to be used by an application circuit 200 and the DC blocking circuit 100. In addition, a voltage source 104 is coupled between the common port 110 via internal load 102 of the DC blocking circuit 100 and an electrical ground to provide a variable bias control voltage $V_{ctrl}$.

In an embodiment, the blocking capacitor 101 blocks undesired DC portion of the RF input signal $RF_{IN}$ and couple AC portion of the RF input signal to the blocking circuit 100 passing a RF output signal $RF_{OUT}$ to the output port 112 that is introduced as an input for an application circuit 200 having an input impedance $Z_{in}$, such as a broadband communication circuit. To execute the above function of blocking the DC portion for the following application circuit 200, the DC blocking circuit 100 is operated at a DC current $I_{bias}$ so that the RF output signal $RF_{OUT}$ at the output port 112 includes both the AC portion of RF signal without any DC components from the original input signal $RF_{IN}$ and a bias current due to the DC current $I_{bias}$ generated by the current source 103. While the voltage source 104 provides the variable bias control voltage $V_{ctrl}$ to set a circuit voltage, in association with the application circuit 200, to $Vx=V_{REF}$ using a close loop control, where $V_{REF}$ is a reference voltage predetermined for the DC blocking circuit 100. As a result, a portion of DC current $I_{bias}$ that is not used as bias current by the application circuit 200 will be consumed by the $V_{ctrl}$ over total impedance of $Z_{ctrl}$ of the internal load 102 plus $Z_{in}$ of the input load of the application circuit 200 that is coupled in parallel to the DC blocking circuit 100 in the close loop.

In another embodiment, the blocking capacitor 101 with capacitance $C_{BLK}$ and the internal load 102 with impedance $Z_{ctrl}$ of the DC blocking circuit 100 of the present invention define an inherent low cut-off frequency response independent from the bias voltages. In particular, the low cut-off frequency $f_{LFC}$ at low frequency at −3 dB gain drop can be estimated using the following RC formula, which is partially correlated to the input impedance $Z_{in}$ of the application circuit 200 that shares a common port 110 with the internal impedance $Z_{ctrl}$:

$f_{LFC}=1/[2\pi C_{BLK}(Z_{ctrl}\|Z_{in})]$.

In an embodiment, the impedance $Z_{ctrl}$ is configured to be substantially smaller, by design, than the input impedance $Z_{in}$ so that the low cut-off frequency is inherently depended only on the capacitance $C_{BLK}$ of the block capacitor 101 and the impedance $Z_{ctrl}$ of the internal load 102 of the DC blocking circuit 100.

In an alternative embodiment, a high cut-off frequency response is also defined by the DC blocking circuit 100 in terms of a low capacitance reactance $(\frac{1}{2}\pi f C_{BLK})\ll Z_{in}$ at high frequencies, and a high internal impedance $Z_{ctrl}\gg Z_{in}$ at high frequencies. More details about the frequency response provided by the DC blocking circuit using the proposed bias with independently defined $f_{LFC}$ can be found throughout the specification and particularly below.

Figure 2:
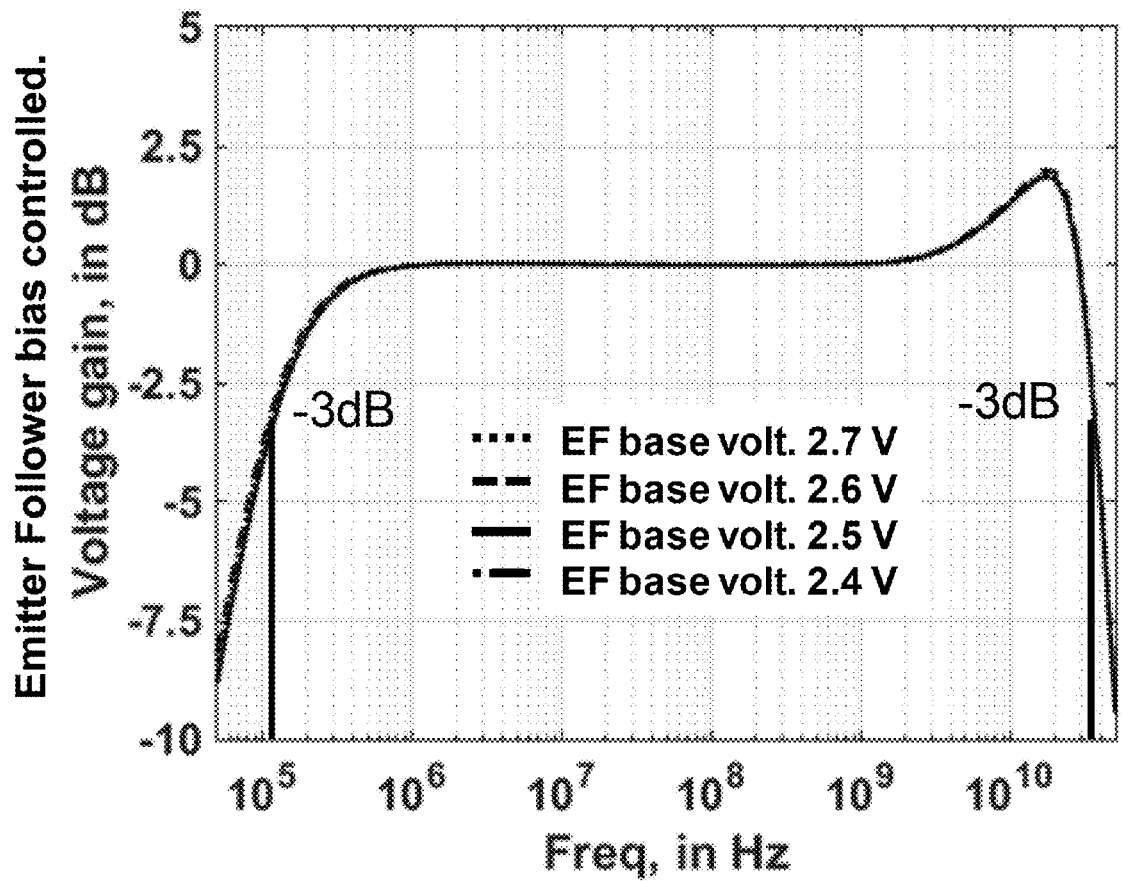
FIG. 2 is a plot of an emitter follower voltage gain versus frequency under various bias voltages with independently defined low-frequency cut-off according to an embodiment of the present invention.

FIG. 2 is a plot of an emitter follower voltage gain versus frequency under various bias voltages with independently defined low cut-off frequency according to an embodiment of the present invention. This diagram is merely an example, which should not unduly limit the scope of the claims herein. One of ordinary skill in the art would recognize many variations, alternatives, and modifications. As shown, in the example, the input port of the application circuit 200 of FIG. 1 is directly coupled to a base node of a bipolar transistor configured as an emitter follower (EF) whose emitter node is subjected to the bias voltage Vx proposed by the DC blocking circuit 100 of FIG. 1 to impose on the close loop control based on a reference voltage $V_{REF}$ pre-set for the DC blocking circuit. The input port of the application circuit 200 is also coupled to an output port 112 of the DC blocking circuit 100 to receive both an RF output signal and a bias voltage $V_b$ on the base node of the EF. The control voltage $V_{ctrl}$ provides the voltage source at different values in association with a bias current at the base node ($I_b$) which is part of DC current $I_{bias}$ provided by the current source of the DC blocking circuit 100.

As shown in FIG. 2, for four different bias voltages of 2.4V to 2.7V at the base node of the EF, a low cut-off frequency at −3 dB gain drop with respect to the gain at 1 GHz is measured at ~120 kHz and remains constant and independent of the bias voltage variations provided to the EF. Also, a high cut-off frequency at −3 dB gain drop with respect to the gain at 1 GHz is measured at 35 GHz and remains constant independent from variation of the bias voltages provided to the based node of the EF. As a result, the voltage (RF signal) gain frequency responses between the measured low cut-off frequency and high cut-off frequency form a stable pass band of the DC blocking circuit under various bias conditions.

Figure 3:
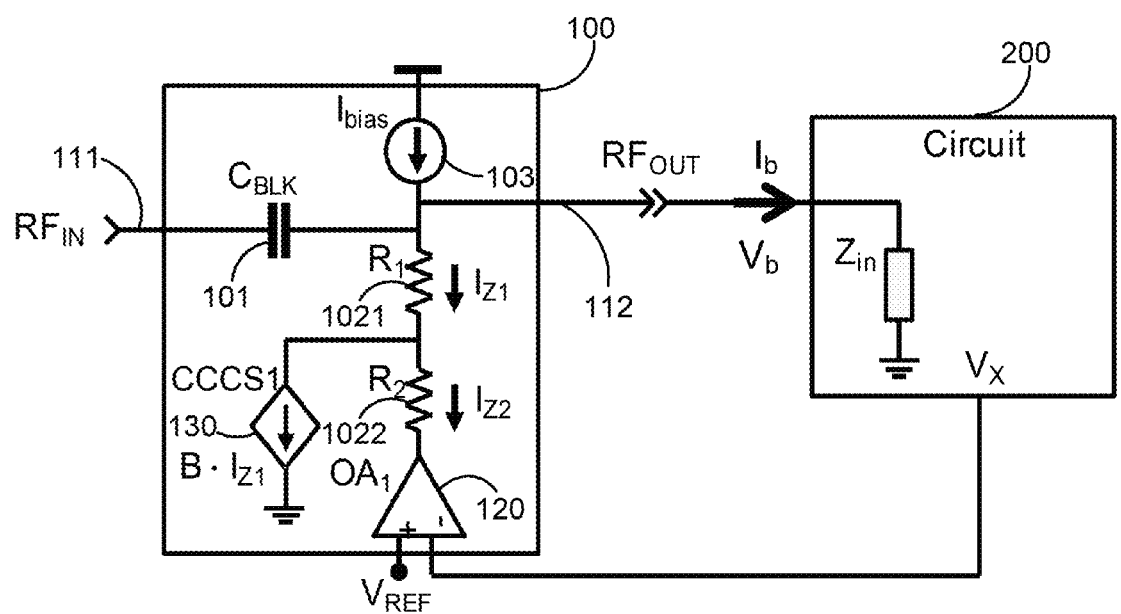
FIG. 3 is a diagram of a DC blocking circuit with an implementation of the control voltage using an operational amplifier and a controlled current source according to a specific embodiment of the present invention.

FIG. 3 is a diagram of a DC blocking circuit with an implementation of the control voltage using an operational amplifier and a controlled current source according to a specific embodiment of the present invention. This diagram is merely an example for specifically implementing the DC blocking circuit to a selected application circuit, which should not unduly limit the scope of the claims herein. One of ordinary skill in the art would recognize many variations, alternatives, and modifications. As shown, the implementation of the bias control voltage $V_{ctrl}$ is done using an operational amplifier OA1 120 connected to a first resistor 1021 having a resistance of $R_1$ and a second resistor 1022 having a resistance of $R_2$ in series with a current controlled current source (CCCS1) 130 coupled to a middle port between the first resistor 1021 and the second resistor 1022. The CCCS1 130 is configured to conduct a current of $B\cdot I_{Z1}$, where B<1 is a predetermined numerical factor associated with CCCS1 130 and $I_{Z1}$ is the current that passes the first resistor 1021. Total resistance, $R_1+R_2=R_{ctrl}$, corresponds in general to total internal impedance $Z_{ctrl}$ of internal load 102 of FIG. 1. Here, $R_{ctrl}$ has been split to use $R_1$ for sensing excess portion of the DC current and sinking a part of the excess portion of the DC current using the CCCS1 130. Additionally, $R_2$ is used for increasing the total resistance of $R_{ctrl}$ to define a high resistance in the control loop. The operational amplifier 120 is implemented to generate the variable bias control voltages. In the embodiment, both supplied DC current $I_{bias}$ 103 and the current controlled current source CCCS1 130 are configured to be implemented a high impedance while the operational amplifier OA1 120 is configured with low AC output impedance.

Referring to FIG. 3, the implementation of the bias control is able to provide a 5× variation of bias current $I_b$ over process, temperature, and bias voltage existing in the circuit 100. In other words, the bias current $I_b$ can be controlled with a 5× variation range from a minimum value to a maximum value depending on the circuit process variation, temperature variation, and bias voltage variation. In the embodiment, the DC current $I_{bias}$ is designed to provide the maximum value of bias current $I_b$ for its application circuit (200). If the bias circuit $I_b$ does not require all the DC current provided by $I_{bias}$, the DC block circuit 100 under the implementation of the bias control should absorb any excess portion DC current produced by $I_{bias}$.

In the example, one excess portion of the DC current $I_{Z1}$ is sensed by resistor $R_1$, and a portion of it is absorbed by the current controlled current source (CCCS1) 130 that is directly coupled to the $R_1$. In a specific embodiment, the portion of DC current absorbed by the CCCS1 130 is $B\cdot I_{Z1}$, where B is a large percentage (e.g., 80 to 90%) in association with the CCCS by design. A smaller percentage of $I_{Z1}$ that is not absorbed by CCCS1 130 is $I_{Z2}$. The DC blocking circuit 100, in this example, is configured to use resistor $R_2$ to sense $I_{Z2}$ and further couple an operational amplifier OA1 120 to absorb the smaller portion of excess DC current. In many implementations of the present invention, variation range of the bias current $I_b$ can be higher than 5× or lower than 5×, depending on specific circuit design. A maximum variation will be limited by the supply voltage ($V_{supply}$), the precision implemented for CCCS1 130, and the capability of OA1 120 to absorb the smaller portion excess current $I_{Z2}$.

In the example of FIG. 3, the bias voltage $V_b$ required by the application circuit 200 is defined in a close loop formed by the OA1, resistor $R_1$, $R_2$, and nodes between output port 112 of the DC blocking circuit 100 and input load $Z_{in}$ of the application circuit 200, where a voltage (Vx) is sensed from the circuit 200 and feedback to the operational amplifier OA1 120 at an "−" node with an "+" node preset to a reference voltage $V_{REF}$. The close loop feedback reduces the difference between Vx and $V_{REF}$ as a differential input signal of the operational amplifier OA1 120 to generate an output voltage with large gain. In ideal case, the difference between Vx and $V_{REF}$ is made to be zero by changing the output voltage. This ensures $Vx=V_{REF}$ and further defines the bias voltage $V_b$ based on specific relationship between the $V_b$ and Vx depending specific application.

Figure 4A:
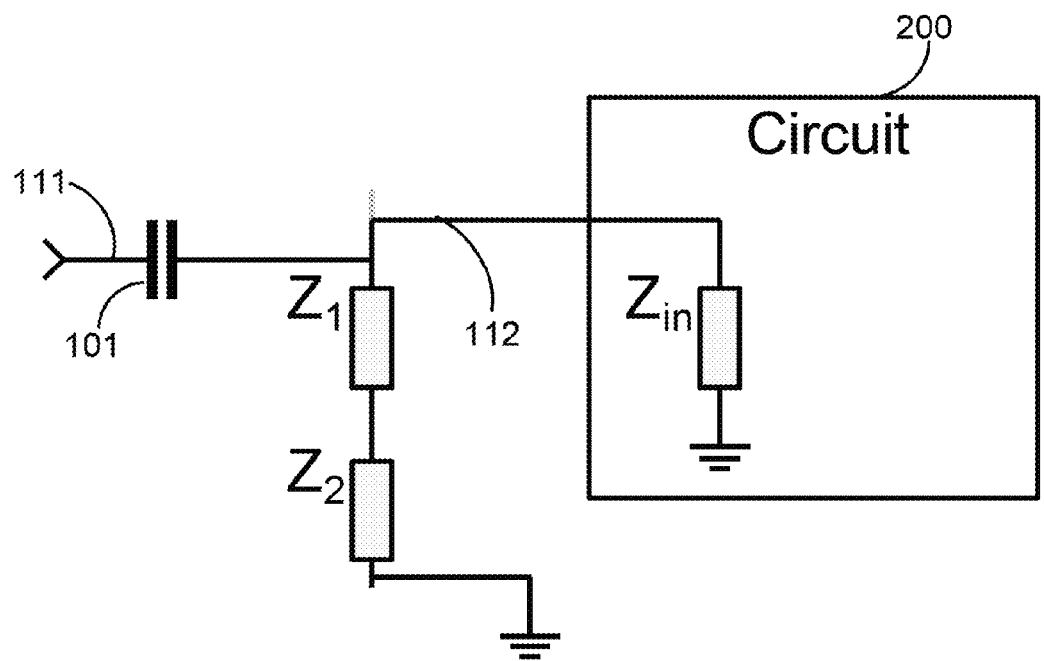
FIG. 4A is a diagram of a virtual circuit of the DC blocking circuit relative to the application circuit under high frequency condition according to an embodiment of the present invention.

FIG. 4A is a diagram of a virtual circuit of the DC blocking circuit relative to the application circuit under high frequency condition according to an embodiment of the present invention. This diagram is merely an example, which should not unduly limit the scope of the claims herein. One of ordinary skill in the art would recognize many variations, alternatives, and modifications. As shown, at high frequency condition, the current supply $I_{bias}$ and the current controlled current source CCCS1 130 have high output impedance, both are seen as an "open" circuit. The operational amplifier OA1 120 has low output impedance and is seen as "short" circuit to ground. Those components and associated portions of the DC blocking circuit in the figure FIG. 3 above are virtually "transparent" for the RF signal, $RF_{IN}$ at input port and $RF_{OUT}$ at output port that connects to an input load of the application circuit.

The total impedance is determined by a parallel combination of $Z_{in}$ of the input load with that of the internal load $Z_1+Z_2$ connected in series with $C_{BLK}$. In an embodiment, under high frequency condition, if by design $Z_1+Z_2 \gg Z_{in}$ and $|1/(2\pi f C_{BLK})| \ll |Z_{in}|$, the high frequency response is determined by a circuit natural frequency response, i.e., by input impedance $Z_{in}$ only.

As a result, the DC blocking circuit 100 of FIG. 1 or FIG. 3 behaves as a band pass filter, defining a high cut-off frequency and a low cut-off frequency. Within the pass band the signal path "sees" the components as shown in FIG. 4A, i.e., the impedance form by $C_{BLK}$, $Z_1$, $Z_2$, and $Z_{in}$. The high cut-off frequency is defined under the conditions that resistance of $Z_1+Z_2 \gg |Z_{in}|$ and reactance $1/(2\pi f C_{BLK})| \ll |Z_{in}|$ are guaranteed in the design of the circuit 100. Then the signal path "sees" only $Z_{in}$, as if the DC blocking circuit 100 of FIG. 3 does not exist. On the other hand, the low cut-off frequency is determined inherently by the DC blocking circuit 100 under a condition that low frequency impedance (or resistance $R_1+R_2$) of $Z_1+Z_2 \ll |Z_{in}|$, yielding the overall low cut-off frequency $f_{LCF}=1/[2\pi(R_1+R_2)C_{BLK}]$.

Of course, there are many optional combinations of varying internal load $Z_1$ plus $Z_2$ in the DC blocking circuit in accordance with different input load $Z_{in}$ associated with various application circuits for blocking unwanted DC signals from required RF signals under various bias conditions while introducing a low cut-off frequency that is independent from the bias conditions. For example, $Z_1=R_1$ and $Z_2=R_2$ are resistors, and $Z_{in}=R+1/(jwC)$, is a resistor in series with a capacitor, depending on a specific application. Then, the following design of $R_1+R_2<R$ at low frequencies and $R_1+R_2 \gg 1/(jwC)$ at high frequencies can be achieved. In another example, $Z_1=jwL$ is an inductor, $Z_2=R_2$ is a resistor, and $Z_{in}=R$ is merely a resistor, depending another specific application. Then a condition of $R_2<R$ at low frequencies and $jwL+R_2 \gg R$ at high frequencies can also be readily developed for implementing the present invention.

Figure 4B:
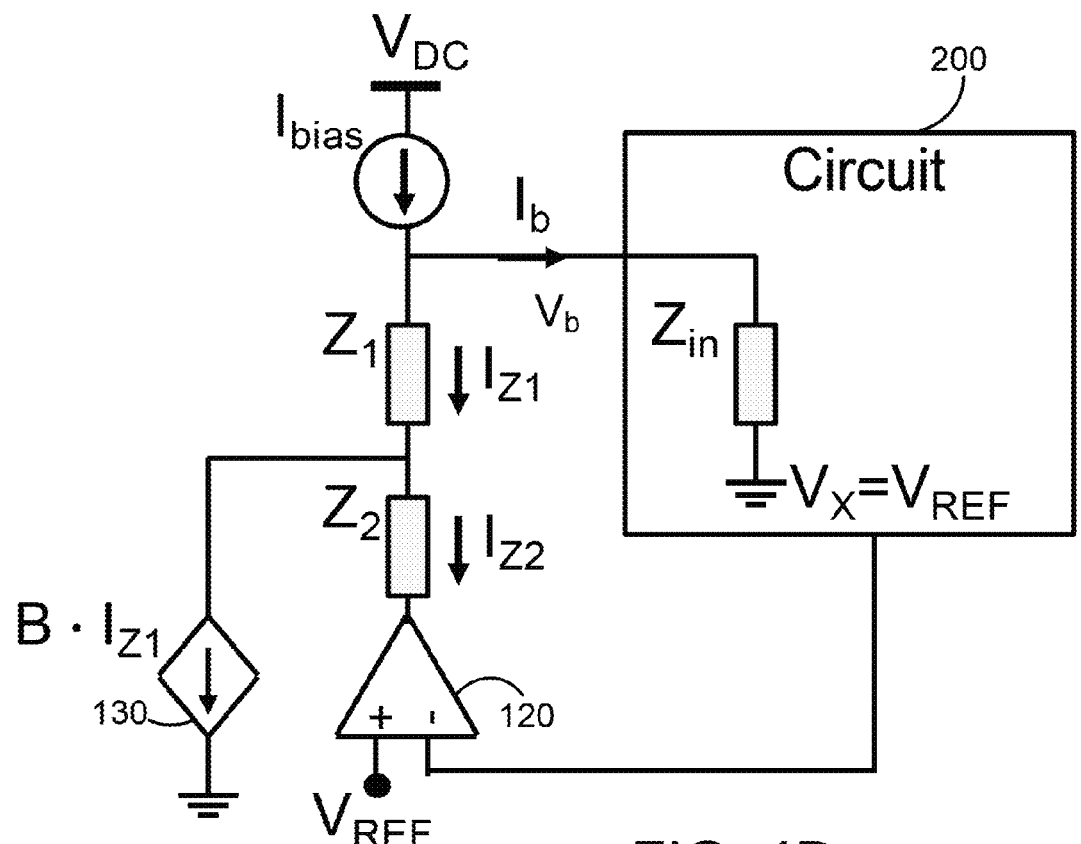
FIG. 4B is a diagram of a virtual circuit of the DC blocking circuit relative to the application circuit at DC or low frequency condition according to an embodiment of the present invention.

FIG. 4B is a diagram of a virtual circuit of the DC blocking circuit relative to the application circuit at DC or low frequency condition according to an embodiment of the present invention. This diagram is merely an example, which should not unduly limit the scope of the claims herein. One of ordinary skill in the art would recognize many variations, alternatives, and modifications. As shown, going other direction to view DC or low frequency behavior of the circuit 100 of FIG. 3, the RF input signal is not visible as if the circuit has no input port. The bias current ($I_b$) at the output port is resulted from $I_{bias}$. The excess current ($I_{Z1}$) is sensed and part of it (determined by B<1) is absorbed by the current controlled current source 130. The remaining portion of the excess current is absorbed by operational amplifier OA1 120. As seen earlier, the close loop of the OA1 120 that connects to internal load $Z_2+Z_1$ and Zin of the application circuit 200 is configured to maximize the bias current $I_b$ while define the bias voltage $V_b$ by making $Vx=V_{REF}$.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A circuit for blocking undesired input direct current of AC-coupled broadband circuits, the circuit comprising:
a capacitor having a first plate coupled to an input port and a second plate coupled to a common node, the input port receiving an RF input signal;
a current source supplying a DC current to the common node leading a bias current to an output port;
a variable voltage source through an internal load forming a close loop with an application circuit having an input load coupled to the output port for determining various bias voltages to control the bias current at the output port in association with a RF output signal that is substantially free of any input direct current originated from the RF input signal and is associated with an inherent low cut-off frequency independent of the various bias voltages.

2. The circuit of claim 1 wherein the low cut-off frequency is determined by capacitance of the capacitor and a parallel combination impedance of the internal load and the input load of the application circuit coupled to the output port and remains a constant as the bias voltages vary in the output port.

3. The circuit of claim 2 wherein the capacitor is configured to have a reactance based on the capacitance at high frequencies substantially smaller than absolute value of impedance of the input load of the application circuit.

4. The circuit of claim 1 wherein the internal load is configured to have impedance at high frequencies substantially greater than high frequency impedance of the input load of the application circuit and also have impedance at low frequencies substantially smaller than low frequency impedance of the input load of the application circuit.

5. The circuit of claim 4 further comprising a high cut-off frequency depended substantially on impedance of the input load of the application circuit.

6. The circuit of claim 4 wherein the internal load comprises a first load connected to a second load in series for absorbing unwanted portion of the DC current generated by the current source, each of the first load and the second load comprising an arbitrary combination of resistor, capacitor, and inductor with a limitation to have high impedance at high frequencies and low impedance at low frequencies compared to the impedance of the input load of the application circuit.

7. The circuit of claim 6 further comprising a current controlled current source connected to the first load for absorbing a major percentage ranging from 80% to 90% of the unwanted portion of the DC current to ground substantially independent of the bias voltages set by the variable voltage source.

8. The circuit of claim 6 wherein the variable voltage source comprises an operational amplifier with low output impedance connected to the second load for substantially absorbing a minor percentage of the unwanted portion of the DC current to ground.

9. The circuit of claim 8 wherein the operational amplifier is configured to receive a differential input defined by a predetermined reference voltage and a feedback voltage from a close loop including the first load, the second load, through the output port to the input load of the application circuit to yield an output voltage with large gain by substantially reducing the differential input to zero, thereby defining the bias voltage at the output port.

10. The circuit of claim 1 wherein the input load of the application circuit is an emitter follower made by a bipolar transistor.

11. A method for blocking undesired input direct current of AC-coupled broadband circuits, the method comprising:
providing a capacitor coupled to an input port and a common node, the input port receiving an RF input signal;
providing a DC current to the common node using a current source based on standard power supply, the DC current leading to a bias current at an output port coupled to the common node;
connecting an internal load to the common node;
providing a variable voltage source to the internal load in a close loop including the output port coupled to an input load of an application circuit for determining various bias voltages to control the bias current;
generating an RF output signal in association with the bias current at the output port substantially free from any DC current originally in the RF input signal; and
providing a low cut-off frequency associated with the RF output signal independent from the various bias voltages.

12. The method of claim 11 wherein providing a capacitor comprises configuring the capacitor with a reactance at high frequencies substantially smaller than absolute value of impedance of the input load of the application circuit.

13. The method of claim 12 wherein the low cut-off frequency is determined only by capacitance of the capacitor and impedance of the internal load.

14. The method of claim 11 wherein the internal load is configured to have impedance at high frequencies substantially greater than high frequency impedance of the input load of the application circuit and also have impedance at low frequencies substantially smaller than low frequency impedance of the input load of the application circuit.

15. The method of claim 11 further comprising providing a high cut-off frequency depended substantially on impedance of the input load of the application circuit.

16. The method of claim 11 wherein connecting an internal load comprises connecting a first load to the common node and connecting a second load to the first load in series for absorbing unwanted portion of the DC current generated by the current source, each of the first load and the second load comprising an arbitrary combination of resistor, capacitor, and inductor with an limitation to have high impedance at high frequencies and low impedance at low frequencies compared to the impedance of the input load of the application circuit.

17. The method of claim 16 further comprising coupling a current controlled current source to the first load for absorbing a major percentage ranging from 80% to 90% of the unwanted portion of the DC current to ground substantially independent of the bias voltages set by the variable voltage source.

18. The method of claim 16 wherein the variable voltage source comprises an operational amplifier with low output impedance connected to the second load for substantially absorbing a minor percentage of the unwanted portion of the DC current to ground.

* * * * *